United States Patent
Luo

(10) Patent No.: US 12,414,375 B2
(45) Date of Patent: Sep. 9, 2025

(54) DRIVING SUBSTRATE, METHOD FOR FABRICATING SAME, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(*) Notice: Subject to any disclaimer, the term of this patent is extended or adjusted under 35 U.S.C. 154(b) by 0 days.

(21) Appl. No.: 17/802,975

(22) PCT Filed: Aug. 15, 2022

(86) PCT No.: PCT/CN2022/112537
§ 371 (c)(1),
(2) Date: Aug. 29, 2022

(87) PCT Pub. No.: WO2024/026926
PCT Pub. Date: Feb. 8, 2024

(65) Prior Publication Data
US 2024/0194685 A1  Jun. 13, 2024

(30) Foreign Application Priority Data
Aug. 5, 2022 (CN) .......................... 202210937617.0

(51) Int. Cl.
*H01L 27/12* (2006.01)
*H01L 25/16* (2023.01)
(Continued)

(52) U.S. Cl.
CPC .......... *H10D 86/60* (2025.01); *H01L 25/167* (2013.01); *H10D 86/0221* (2025.01); *H10D 86/421* (2025.01)

(58) Field of Classification Search
CPC .. H10D 86/60; H10D 86/0221; H10D 86/421; H10D 1/045; H10D 10/821;
(Continued)

(56) References Cited

U.S. PATENT DOCUMENTS 6,534,788 B1    3/2003  Yeo et al.
2020/0144304 A1*  5/2020  Ji ..................... H01L 29/66969

FOREIGN PATENT DOCUMENTS

CN    107046002 A    8/2017
CN    111142297 A    5/2020
(Continued)

OTHER PUBLICATIONS

International Search Report in International application No. PCT/CN2022/112537, mailed on Dec. 21, 2022.
(Continued)

*Primary Examiner* — Mohammed R Alam

(57) ABSTRACT

A driving substrate includes a substrate, a source electrode, a drain electrode, an active layer, and a gate electrode. The source electrode and the drain electrode are disposed on the substrate. There is a first space between the source electrode and the drain electrode. The active layer is disposed on the substrate, the source electrode, and the drain electrode, and includes a channel, a source region, and a drain region. The source region covers at least part of the source electrode. The drain region covers at least part of the drain electrode. The channel corresponds to the first space. The gate electrode is disposed on a side of the active layer away from the source electrode and the drain electrode, and is disposed corresponding to the active layer. A method is used for fabricating the driving substrate. A display panel includes the driving substrate.

16 Claims, 4 Drawing Sheets

(51) Int. Cl.
*H10D 86/01* (2025.01)
*H10D 86/40* (2025.01)
*H10D 86/60* (2025.01)

(58) Field of Classification Search
CPC .... H10D 64/511; H01L 25/167; A01G 13/20; A23B 2/733; A23B 45/10; A23B 11/87
See application file for complete search history.

(56) References Cited

FOREIGN PATENT DOCUMENTS

| | | | |
|---|---|---|---|
| CN | 113363328 A | 9/2021 | |
| JP | H10125926 A | 5/1998 | |
| KR | 20080059801 A | 7/2008 | |
| WO | 2022083429 A1 | 4/2022 | |

OTHER PUBLICATIONS

Written Opinion of the International Search Authority in International application No. PCT/CN2022/112537, mailed on Dec. 21, 2022.
Chinese Office Action issued in corresponding Chinese Patent Application No. 202210937617.0 dated May 30, 2025, pp. 1-8.

\* cited by examiner

DRIVING SUBSTRATE, METHOD FOR FABRICATING SAME, AND DISPLAY PANEL

FIELD OF INVENTION

The present disclosure relates to the technical field of display, and particularly to a driving substrate, a method for fabricating the same, and a display panel.

BACKGROUND

Thin film transistors (TFTs) have been widely used in driving of active displays. As a size of a display continues to increase, so does its driving frequency. For a thin film transistor, an electron mobility of a channel region of an active layer affects an operating frequency of the thin film transistor. Improvement of the electron mobility is beneficial to improvement of performances of the thin film transistor.

In order to improve the electron mobility of the thin film transistor, a material of the active layer may be changed or a width of the channel region of the thin film transistor may be increased. However, an increase in the width of the channel region of the thin film transistor leads to an increase in a size of an entirety of the thin film transistor, which is not conducive to realizing a high-resolution display. As a result, the improvement of the electron mobility of the thin film transistor is limited.

SUMMARY OF DISCLOSURE

The present disclosure provides a driving substrate, a method for fabricating the same, and a display panel to solve a technical problem that improvement of an electron mobility of a current thin film transistor is limited.

In order to solve the above technical problem, the present disclosure provides the following technical solutions.

The present disclosure provides a driving substrate comprising a substrate, a source electrode, a drain electrode, an active layer, and a gate electrode. The source electrode and the drain electrode are disposed on the substrate. There is a first space between the source electrode and the drain electrode. The active layer is disposed on the substrate, the source electrode, and the drain electrode, and comprises a channel and a source region and a drain region on both sides of the channel. The source region covers at least part of the source electrode. The drain region covers at least part of the drain electrode. The channel corresponds to the first space. The gate electrode is disposed on a side of the active layer away from the source electrode and the drain electrode, and is disposed corresponding to the active layer.

In an embodiment, an orthographic projection of the gate electrode on the substrate covers an orthographic projection of the channel of the active layer on the substrate, covers an orthographic projection of at least part of the source region of the active layer on the substrate, and covers an orthographic projection of at least part of the drain region of the active layer on the substrate.

In an embodiment, the driving substrate further comprises an auxiliary source electrode and an auxiliary drain electrode. The auxiliary source electrode is disposed between the source electrode and the substrate and is electrically connected to the source electrode. The auxiliary drain electrode is disposed between the drain electrode and the substrate and is electrically connected to the drain electrode.

In an embodiment, the driving substrate further comprises a conductive layer disposed on a side of the gate electrode away from the active layer, insulated from the gate electrode, and comprising a first electrode and a connecting wire that are spaced apart. The first electrode is electrically connected to the source electrode and the auxiliary source electrode, and the connecting wire is electrically connected to the drain electrode and the auxiliary drain electrode.

In an embodiment, an orthographic projection of the first electrode on the substrate at least covers the orthographic projection of the channel on the substrate.

In an embodiment, the driving substrate further comprises a buffer layer covering the auxiliary source electrode and the auxiliary drain electrode. The source electrode and the drain electrode are disposed on the buffer layer, and are respectively electrically connected to the corresponding source auxiliary electrode and the drain auxiliary electrode through via holes of the buffer layer.

In an embodiment, in a direction perpendicular to the substrate, a thickness of the source electrode is less than a thickness of the auxiliary source electrode, and a thickness of the drain electrode is less than a thickness of the auxiliary drain electrode.

In an embodiment, an orthographic projection of the auxiliary source electrode on the substrate at least covers the orthographic projection of the channel on the substrate.

In an embodiment, the driving substrate further comprises an auxiliary source electrode and an auxiliary drain electrode that are disposed on a side of the gate electrode away from the active layer and are insulated from the gate electrode. The auxiliary source electrode is electrically connected to the source electrode, and the auxiliary drain electrode is electrically connected to the drain electrode.

In an embodiment, the source electrode and the drain electrode are made of metal oxide.

The present disclosure further provides a display panel comprising the driving substrate of one of the foregoing embodiments.

The present disclosure further provides a method for fabricating a driving substrate, comprising: providing a substrate; forming a source electrode and a drain electrode on the substrate, wherein there is a first space between the source electrode and the drain electrode; forming an active layer on the substrate, the source electrode, and the drain electrode, wherein the active layer comprises a channel and a source region and a drain region on both sides of the channel, the source region covers at least part of the source electrode, the drain region covers at least part of the drain electrode, and the channel corresponds to the first space; and forming a gate electrode on a side of the active layer away from the substrate, wherein an orthographic projection of the gate electrode on the substrate covers an orthographic projection of the channel of the active layer on the substrate, covers an orthographic projection of at least part of the source region of the active layer on the substrate, and covers an orthographic projection of at least part of the drain region of the active layer on the substrate.

In an embodiment, before the forming the source electrode and the drain electrode on the substrate, the method further comprises: forming a first metal thin film on the substrate by physical vapor deposition; patterning the first metal thin film to form an auxiliary source electrode and an auxiliary drain electrode; and depositing a buffer layer on the auxiliary source electrode, the auxiliary drain electrode, and the substrate by chemical vapor deposition; wherein the source electrode and the drain electrode are formed on the buffer layer.

In an embodiment, the method further comprises: forming a conductive layer on a side of the gate electrode away from the active layer, wherein the conductive layer comprises a first electrode and a connecting wire that are spaced apart, the first electrode is electrically connected to the source electrode and the auxiliary source electrode, and the connecting wire is electrically connected to the drain electrode and the auxiliary drain electrode.

The present disclosure provides a driving substrate, a method for fabricating the same, and a display panel. The driving substrate comprises a substrate, a source electrode, a drain electrode, and an active layer. The source electrode, the drain electrode, and the active layer are disposed on the substrate. There is a first space between the source electrode and the drain electrode. The active layer is further disposed on the source electrode and the drain electrode. The active layer comprises a channel and a source region and a drain region on both sides of the channel. The source region covers at least part of the source electrode. The drain region covers at least part of the drain electrode. The channel corresponds to the first space. In this way, a length of the channel of the active layer is defined by a space between the source electrode and the drain electrode, so as to reduce the length of the channel of the active layer, thereby improving an electron mobility of the channel of the active layer and solving a problem that improvement of an electron mobility of a current thin film transistor is limited.

BRIEF DESCRIPTION OF DRAWINGS

In order to more clearly illustrate technical solutions in embodiments or the prior art, a brief description of accompanying drawings used in the embodiments or the prior art will be given below. The accompanying drawings in the following description are merely some embodiments of the present disclosure. For those skilled in the art, other drawings may be obtained from these accompanying drawings without creative labor.

DETAILED DESCRIPTION

Figure 1:
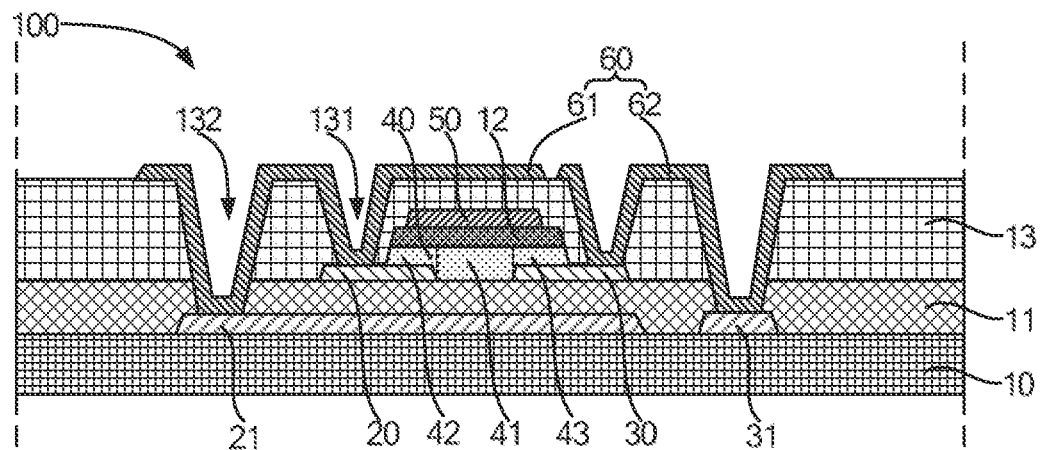
FIG. 1 is a schematic cross-sectional structure diagram of a driving substrate according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals. In the accompanying drawings, thicknesses of some layers and regions are exaggerated for clarity of understanding and ease of description. That is, a size and thickness of each component shown in the accompanying drawings are arbitrarily shown, and thus the present application is not limited thereto.

Please refer to FIG. 1, which is a schematic cross-sectional structure diagram of a driving substrate 100 according to an embodiment of the present disclosure. The driving substrate 100 comprises a substrate 10, a source electrode 20, a drain electrode 30, an active layer 40, and a gate electrode 50. The source electrode 20, the drain electrode 30, the active layer 40, and the gate electrode 50 are disposed on the substrate 10. There is a first space between the source electrode 20 and the drain electrode 30. The active layer 40 is disposed on the substrate 10, the source electrode 20, and the drain electrode 30. The active layer 40 comprises a channel 41 and a source region 42 and a drain region 43 on both sides of the channel 41. The source region 42 covers at least part of the source electrode 20. The drain region covers 43 at least part of the drain electrode 30. The channel 41 corresponds to the first space. The gate electrode 50 is disposed on a side of the active layer 40 away from the source electrode 20 and the drain electrode 30, and is disposed corresponding to the active layer 40.

In this embodiment, a length of the channel 41 of the active layer 40 is defined by the first space between the source electrode 20 and the drain electrode 30, so as to achieve a shorter length of the channel 41. In this way, the length of the channel 41 of the active layer 40 is reduced, thereby increasing an electron mobility of the channel 41 of the active layer 40, and solving a problem that improvement of an electron mobility of a current thin film transistor is limited.

In an embodiment, the driving substrate 100 further comprises an auxiliary source electrode 21 and an auxiliary drain electrode 31. The auxiliary source electrode 21 is disposed between the source electrode 20 and the substrate 10 and is electrically connected to the source electrode 20, so as to reduce a resistance of the source electrode 20. The auxiliary drain electrode 31 is disposed between the drain electrode 30 and the substrate 10 and is electrically connected to the drain electrode 30, so as to reduce a resistance of the drain electrode 30.

Optionally, the substrate 10 may be a rigid substrate or a flexible substrate. When the substrate 10 is a rigid substrate, the substrate 10 may be a glass substrate, a plastic substrate, or other rigid substrate. When the substrate 10 is a flexible substrate, the substrate 10 may be a polyimide (PI) film, an ultra-thin glass film, or other flexible substrate.

The auxiliary source electrode 21 and the auxiliary drain electrode 31 are disposed on the substrate 10. There is a space between the auxiliary source electrode 21 and the auxiliary drain electrode 31. The auxiliary source electrode 21 and the auxiliary drain electrode 31 are insulated from each other. Optionally, the auxiliary source electrode 21 and the auxiliary drain electrode 31 are made of one or a combination of low resistivity metals such as Mo, Al, Cu, and Ti, for example, Mo/Al, Mo/Cu, MoTi/Cu, MoTi/Cu/ MoTi, Ti/Al/Ti, Ti/Cu/Ti, Mo/Cu/IZO, IZO/Cu/IZO, or Mo/Cu/ITO.

The driving substrate 100 further comprises a buffer layer 11 covering the auxiliary source electrode 21 and the auxiliary drain electrode 31. The source electrode 20 and the drain electrode 30 are disposed on a side of the buffer layer 11 away from the substrate 10. The active layer 40 covers at least part of the source electrode 20, at least part of the drain electrode 30, and the buffer layer 11.

Specifically, the buffer layer 11 covers the auxiliary source electrode 21, the auxiliary drain electrode 31, and the substrate 10. The buffer layer 11 prevents undesired impurities or contaminants (e.g., moisture, oxygen, etc.) from diffusing from the substrate 10 into a device that may be damaged by these impurities or contaminants. Optionally, the buffer layer 11 is made of silicon oxide (SiOx), silicon nitride (SiNx), or a stack of silicon oxide and silicon nitride.

Meanwhile, the buffer layer 11 further provides a flat top surface, so as to facilitate formation of the source electrode 20, the drain electrode 30, and the active layer 40 on the buffer layer 11. The flat top surface is more favorable for the active layer 40 to have good interface properties.

The source electrode 20 and the drain electrode 30 are formed on the buffer layer 11. There is the first space between the source electrode 20 and the drain electrode 30. The source electrode 20 and the drain electrode 30 are made ITO, IZO, AnCl, or other metal oxide with low resistivity. For example, the source electrode 20 and the drain electrode 30 are made of a metal oxide such as ITO. A difference in an etching size of a metal oxide such as ITO in a yellow light process is small. Due to a limitation of an exposure machine, a length of the first space between the source electrode 20 and the drain electrode 30 is made smaller, so that the active layer 40 has one channel 41 with a smaller length, thereby improving the electron mobility of the channel 41 of the active layer 40.

Furthermore, in a direction perpendicular to the substrate 10 and from the substrate 10 to the source electrode 20, a thickness of the auxiliary source electrode 21 is greater than a thickness of the source electrode 20, and a thickness of the auxiliary drain electrode 31 is greater than a thickness of the drain electrode 30, so as to further reduce a resistance of the auxiliary source electrode 21 and a resistance of the auxiliary drain electrode 31.

The active layer 40 covers at least part of the source electrode 20, at least part of the drain electrode 30, and the buffer layer 11. The active layer 40 is formed on the source electrode 20 and the drain electrode 30 to prevent the active layer 40 from being affected by an etching solution when the source electrode 20 and the drain electrode 30 are formed by etching. If the etching solution is in contact with the active layer 40, the etching solution will etch the active layer 40 and change In, Ga, and Zn plasma concentrations on a surface of the active layer 40, thereby affecting stability and reliability of the device. Optionally, the active layer 40 is made of a semiconductor metal oxide such as IGZO, IGZTO, IGTO, IGO, or AZTO.

The channel 41 of the active layer 40 is disposed corresponding to the first space. In the direction perpendicular to the substrate 10 and from the substrate 10 to the source electrode 20, a thickness of the active layer 40 is greater than the thickness of the source electrode 20 or the thickness of the drain electrode 30. Therefore, the channel 41 of the active layer 40 is located in the first space, and a height of the channel 41 is greater than a height of the source electrode 20 and the drain electrode 30. The source region 42 of the active layer 40 covers the source electrode 20, and the drain region 43 of the active layer 40 covers the drain electrode 30. Accordingly, surfaces of the source region 42, the channel 41, and the drain region 43 of the active layer 40 away from the buffer layer 11 are horizontal, so that a surface of the active layer 40 away from the buffer layer 11 is horizontal.

An orthographic projection of the channel 41 of the active layer 40 on the substrate 10 falls within an orthographic projection of the auxiliary source electrode 21 on the substrate 10. Therefore, the auxiliary source electrode 21 further has a light shielding function to prevent light from irradiating the channel 41 of the active layer 40. Moreover, the orthographic projection of the auxiliary source electrode 21 on the substrate 10 may further cover an orthographic projection of an entirety of the active layer 40 on the substrate 10. That is, orthographic projections of the source region 42 and the drain region 43 of the active layer 40 on the substrate 10 also fall within the orthographic projection of the auxiliary source electrode 21 on the substrate 10.

Furthermore, an orthographic projection of the source electrode 20 on the substrate 10 falls within the orthographic projection of the auxiliary source electrode 21 on the substrate 10. An area of the orthographic projection of the source electrode 20 on the substrate 10 is less than an area of the orthographic projection of the auxiliary source electrode 21 on the substrate 10. Meanwhile, an area of an orthographic projection of the drain electrode 30 on the substrate 10 is less than an area of an orthographic projection of the auxiliary drain electrode 31 on the substrate 10.

How to electrically connect the source electrode 20 and the drain electrode 30 to the auxiliary source electrode 21 and the auxiliary drain electrode 31 respectively will be described in detail below.

In an embodiment, the gate electrode 50 is located on the active layer 40 and is insulated from the active layer 40. The gate electrode 50 is disposed corresponding to the active layer 40. Specifically, the driving substrate 100 further comprises a gate insulating layer 12 disposed between the gate electrode 50 and the active layer 40. The gate insulating layer 12 covers the active layer 40. The gate electrode 50 is disposed on the gate insulating layer 12.

The gate insulating layer 12 is also disposed corresponding to the active layer 40. An orthographic projection of the gate insulating layer 12 on the substrate 10 overlaps the orthographic projection of the active layer 40 on the substrate 10. Optionally, the gate insulating layer 12 is made of one or a combination of SiOx, SiNx, and Al2O3, for example, Al2O3/SiNx/SiOx, or SiOx/SiNx/SiOx.

The gate electrode 50 is disposed on the gate insulating layer 12. Optionally, a material of the gate electrode 50 is same as a material of the auxiliary source electrode 21. An orthographic projection of the gate electrode 50 on the substrate 10 covers an orthographic projection of the channel 41 of the active layer 40 on the substrate 10, covers an orthographic projection of at least part of the source region 42 of the active layer 40 on the substrate 10, and covers an orthographic projection of at least part of the drain region 43 of the active layer 40 on the substrate 10. Therefore, in the direction perpendicular to the substrate 10, the gate electrode 50 partially overlaps the source electrode 20, and the gate electrode 50 partially overlaps the drain electrode 30.

It can be understood that when there is a driving voltage on the gate electrode 50, an electric field is formed between the gate electrode 50 and the corresponding source electrode 20, and such electric field can change the source region 42 of the active layer 40 between the gate electrode 50 and the source electrode 20 from a semiconductor to a conductor.

Similarly, when there is a driving voltage on the gate electrode 50, an electric field is formed between the gate electrode 50 and the corresponding drain electrode 30, and such electric field can change the drain region 43 of the active layer 40 between the gate electrode 50 and the drain electrode 30 from a semiconductor to a conductor. Therefore, the source region 42 and the drain region 43 of the active layer 40 do not need to be conductorized by a conductorization process, such as plasma doping.

In an embodiment, the driving substrate 100 further comprises a conductive layer 60 disposed on a side of the gate electrode 50 away from the active layer 40 and insulated from the gate electrode 50. The conductive layer 60 comprises a first electrode 61 and a connecting wire 62 that are spaced apart. The first electrode 61 is electrically connected to the source electrode 20 and the auxiliary source electrode 21, so as to realize electrical connection between the source electrode 20 and the auxiliary source electrode 21, and simultaneously realize electrical connection between the first electrode 61 and the source electrode 20. The connecting wire 62 is electrically connected to the drain electrode 30 and the auxiliary drain electrode 31, so as to realize electrical connection between the drain electrode 30 and the auxiliary drain electrode 31.

Optionally, the driving substrate 100 further comprises a passivation layer 13 disposed between the conductive layer 60 and the gate electrode 50. The passivation layer 13 covers the gate electrode 50, a part of the source electrode 20, a part of the drain electrode 30, and the buffer layer 11. A plurality of first via holes 131 and a plurality of second via holes 132 are formed in the passivation layer 13. The first via holes 131 penetrate through the passivation layer 13, one of the first via holes 131 exposes another part of the source electrode 20, and the other one of the first via holes 131 exposes another part of the drain electrode 30. The second via holes 132 penetrate through the passivation layer 13 and the buffer layer 11, one of the second via holes 132 exposes a part of the auxiliary source electrode 21, and the other one of the second via holes 132 exposes a part of the auxiliary drain electrode 31.

The first electrode 61 is electrically connected to the source electrode 20 through one first via hole 131. At the same time, the first electrode 61 is also electrically connected to the auxiliary source electrode 21 through one second via hole 132. The connecting wire 62 is electrically connected to the drain electrode 30 through the other first via hole 131. At the same time, the connecting wire 62 is also electrically connected to the auxiliary drain electrode 31 through the other second via hole 132. In this way, a mask can realize the electrical connection between the source electrode 20 and the corresponding auxiliary source electrode 21, the electrical connection between the drain electrode 30 and the corresponding auxiliary drain electrode 31, and the electrical connection between the first electrode 61 and the source electrode 20, which is beneficial to save cost.

In an embodiment, an orthographic projection of the first electrode 61 on the substrate 10 at least covers the orthographic projection of the channel 41 on the substrate 10. The first electrode 61 is set to have a larger area, which can prevent moisture in an environment from diffusing to the channel 41 of the active layer 40, thereby improving the reliability of the device.

Optionally, in order to better block the moisture in the environment, the orthographic projection of the first electrode 61 on the substrate 10 may cover an orthographic projection of an entirety of the gate electrode 50 on the substrate. 10, so that to form a larger area of the first electrode 61 has a larger area.

Figure 2:
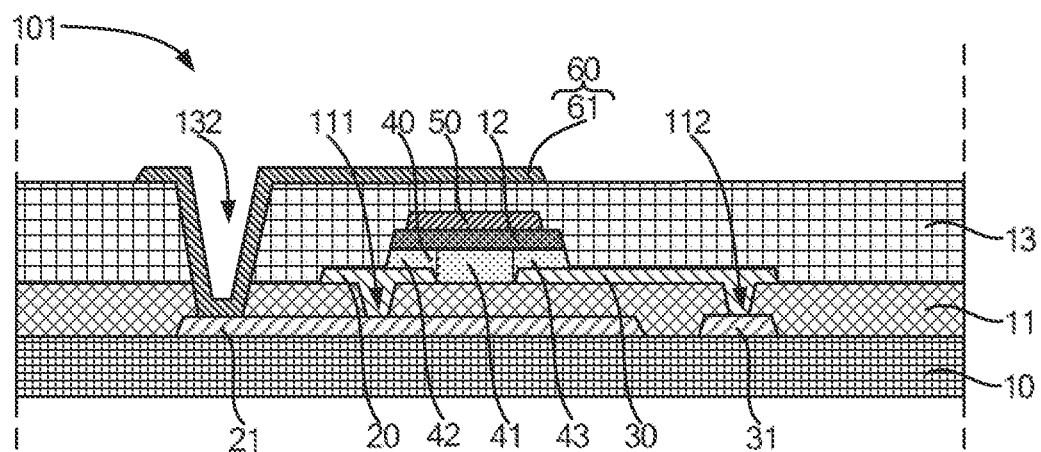
FIG. 2 is another schematic cross-sectional structure diagram of a driving substrate according to an embodiment of the present disclosure.

In an embodiment, please refer to FIG. 2, which is another schematic cross-sectional structure diagram of a driving substrate 101 according to an embodiment of the present disclosure. Different from the aforementioned embodiment, in the driving substrate 101, a source electrode 20 and a drain electrode 30 are respectively electrically connected to a corresponding auxiliary source electrode 21 and a corresponding auxiliary drain electrode 31 through via holes of a buffer layer 11.

Specifically, the buffer layer 11 is provided with a third via hole 111 and a fourth via hole 112. The third via hole 111 penetrates through the buffer layer 11 and exposes a part of the auxiliary source electrode 21. The fourth via hole 112 penetrates through the buffer layer 11 and exposes a part of the auxiliary drain electrode 31. The source electrode 20 is electrically connected to the auxiliary source electrode 21 through the third via hole 111. The drain electrode 30 is electrically connected to the auxiliary drain electrode 31 through the fourth via hole 112. For other descriptions, please refer to the aforementioned embodiment, which will not be described in detail herein.

Figure 3:
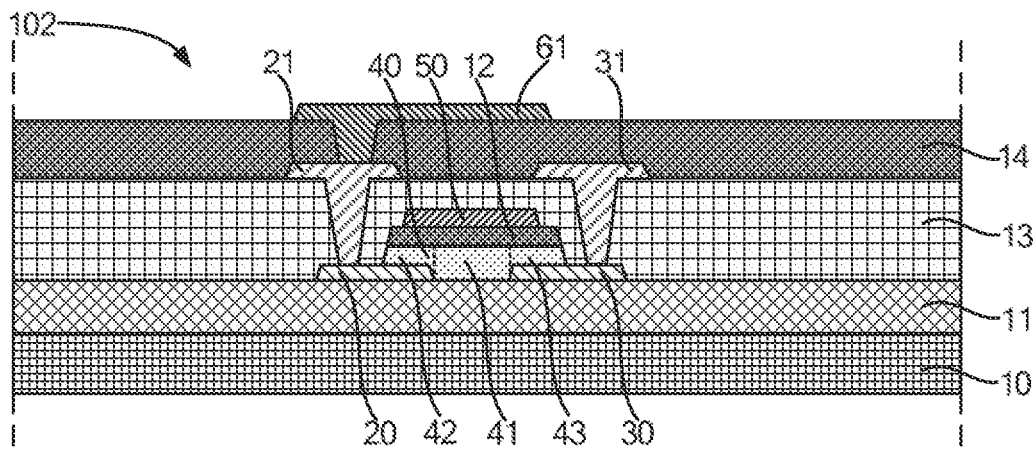
FIG. 3 is yet another schematic cross-sectional structure diagram of a driving substrate according to an embodiment of the present disclosure.

In an embodiment, please refer to FIG. 3, which is yet another schematic cross-sectional structure diagram of a driving substrate 102 according to an embodiment of the present disclosure. Different from the aforementioned embodiments, in the driving substrate 102, an auxiliary source electrode 21 and an auxiliary drain electrode 31 are disposed on a side of a gate electrode 50 away from an active layer 40 and are insulated from the gate electrode 50, the auxiliary source electrode 21 is electrically connected to a source electrode 20, and the auxiliary drain electrode 31 is electrically connected to a drain electrode 30.

Specifically, the auxiliary source electrode 21 and the auxiliary drain electrode 31 are disposed on a passivation layer 13. The passivation layer 13 is provided with a plurality of via holes penetrating the passivation layer 13 and exposing a part of the source electrode 20 and a part of the drain electrode 30. The auxiliary source electrode 21 is electrically connected to the source electrode 20 through one via hole in the passivation layer 13. The auxiliary drain electrode 31 is electrically connected to the drain electrode 30 through the other via hole in the passivation layer 13.

The driving substrate 102 further comprises a planarization layer 14 covering the auxiliary source electrode 21 and the auxiliary drain electrode 31. A first electrode 61 is disposed on the planarization layer 14. The planarization layer 14 is provided with a via hole penetrating the planarization layer 14 and exposing a part of the auxiliary source electrode 21. The first electrode 61 is electrically connected to the auxiliary source electrode 21 through the via hole in the planarization layer 14. For other descriptions, please refer to the aforementioned embodiments, which will not be described in detail herein.

Figure 4:
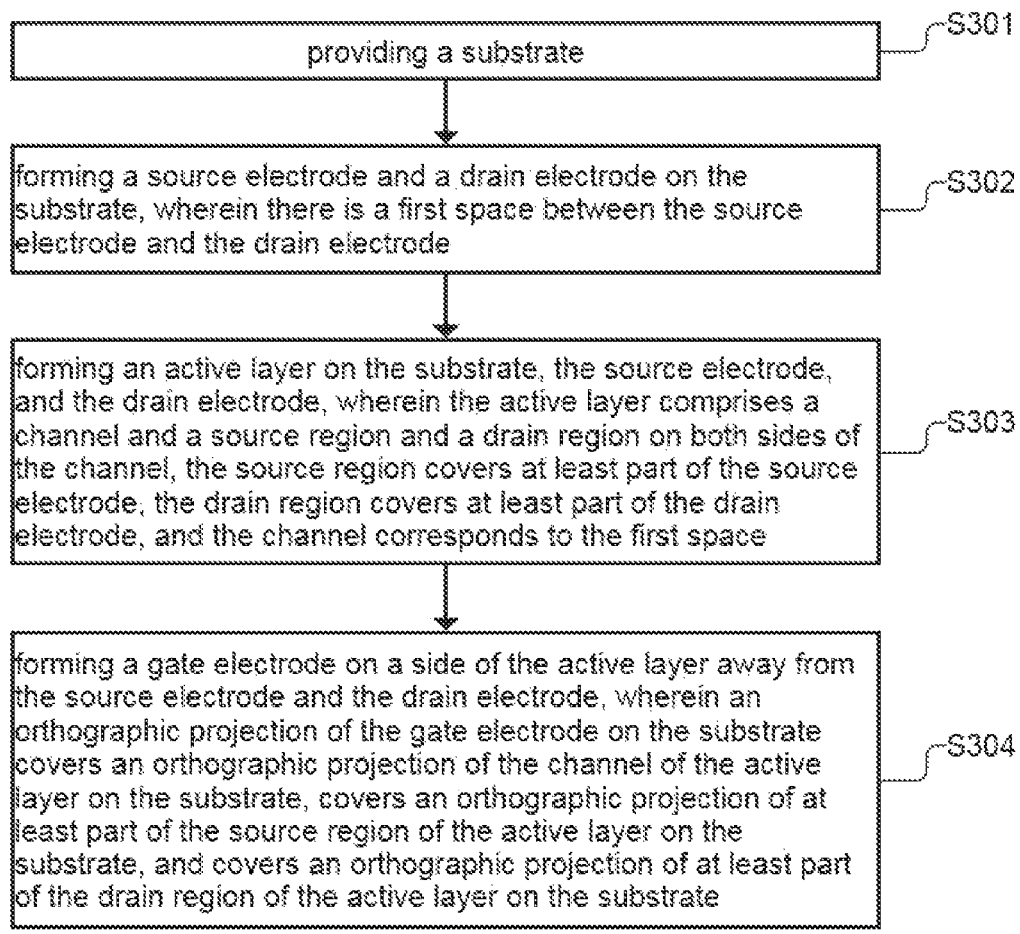
FIG. 4 is a schematic flowchart of a method for fabricating a driving substrate according to an embodiment of the present disclosure.
Figure 5:
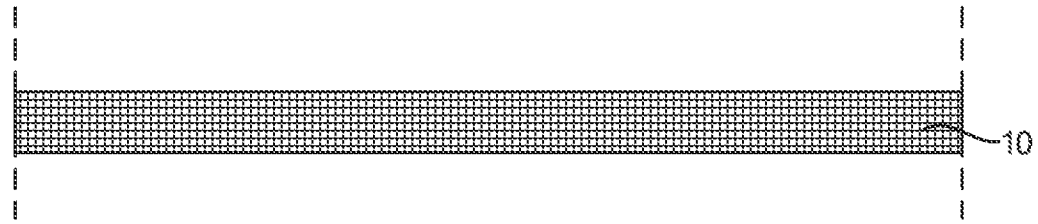
FIG. 5 is a schematic cross-sectional structure diagram of a substrate according to an embodiment of the present disclosure.
Figure 6:
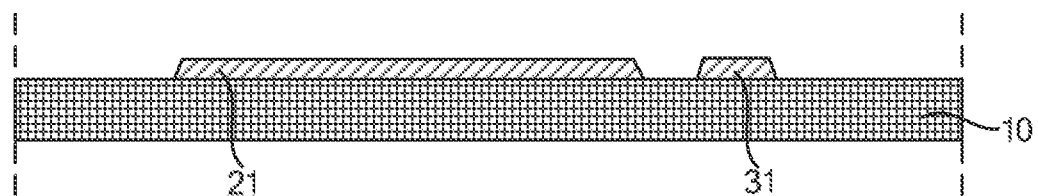
FIG. 6 is a schematic cross-sectional structure diagram of forming an auxiliary source electrode and an auxiliary drain electrode on the substrate of FIG. 5.
Figure 7:
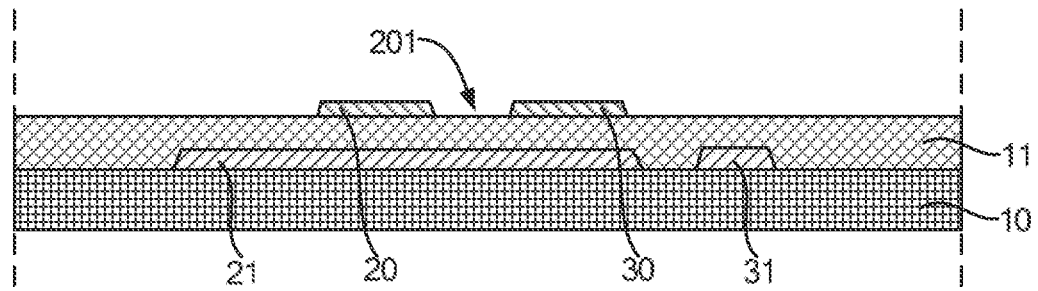
FIG. 7 is a schematic cross-sectional structure diagram of forming a source electrode and a drain electrode on a structure of FIG. 6.
Figure 8:
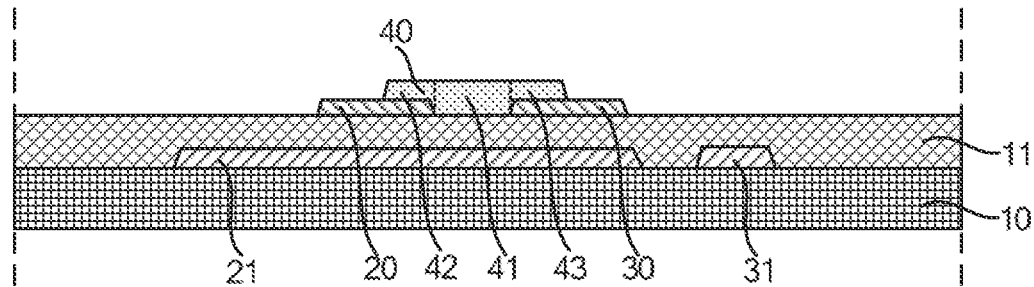
FIG. 8 is a schematic cross-sectional structure diagram of forming an active layer on a structure of FIG. 7.
Figure 9:
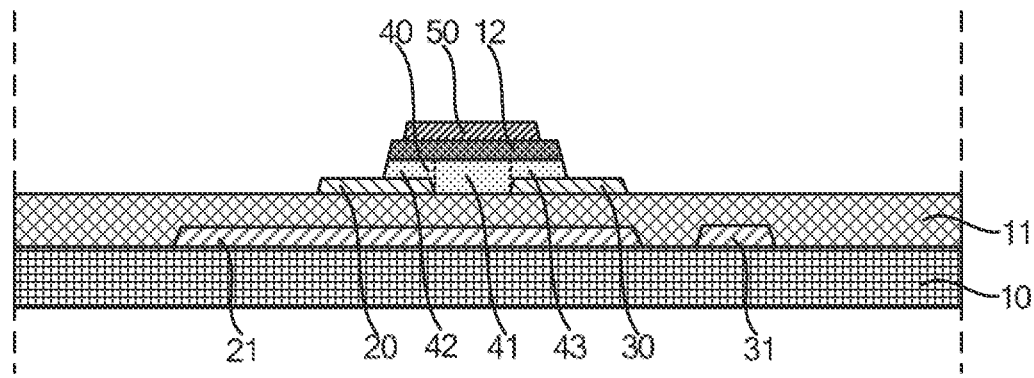
FIG. 9 is a schematic cross-sectional structure diagram of forming a gate electrode on a structure of FIG. 8.
Figure 10:
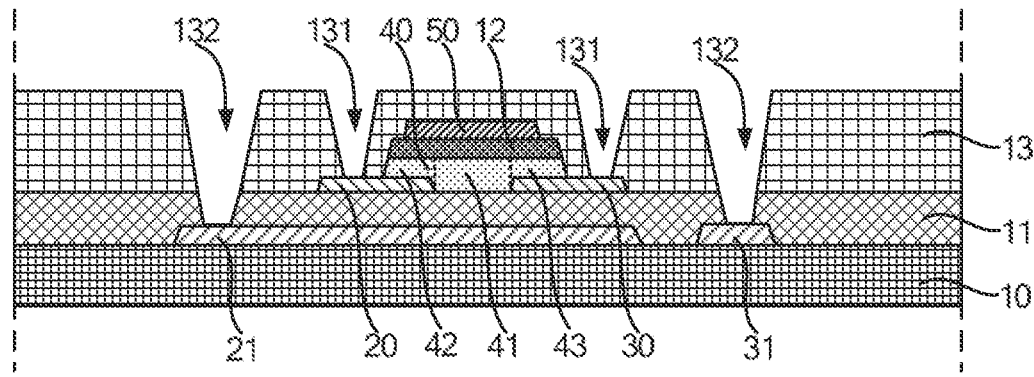
FIG. 10 is a schematic cross-sectional structure diagram of forming a passivation layer on a structure of FIG. 9.

The present disclosure further provides a method for fabricating a driving substrate. Please refer to FIG. 4 to FIG. 10. FIG. 4 is a schematic flowchart of a method for fabricating a driving substrate according to an embodiment of the present disclosure. FIG. 5 is a schematic cross-sectional structure diagram of a substrate according to an embodiment of the present disclosure. FIG. 6 is a schematic cross-sectional structure diagram of forming an auxiliary source electrode and an auxiliary drain electrode on the substrate of FIG. 5. FIG. 7 is a schematic cross-sectional structure diagram of forming a source electrode and a drain electrode on a structure of FIG. 6. FIG. 8 is a schematic cross-sectional structure diagram of forming an active layer on a structure of FIG. 7. FIG. 9 is a schematic cross-sectional structure diagram of forming a gate electrode on a structure of FIG. 8. FIG. 10 is a schematic cross-sectional structure diagram of forming a passivation layer on a structure of FIG. 9. The method for fabricating the driving substrate comprises the following steps.

S301: providing a substrate 10.

Specifically, the substrate 10 is provided, as shown in FIG. 5. The substrate 10 may be a rigid substrate or a flexible substrate. When the substrate 10 is a rigid substrate, the substrate 10 may be a glass substrate, a plastic substrate, or other rigid substrate. When the substrate 10 is a flexible substrate, the substrate 10 may be a polyimide (PI) film, an ultra-thin glass film, or other flexible substrate.

S302: forming a source electrode 20 and a drain electrode 30 on the substrate 10, wherein there is a first space between the source electrode 20 and the drain electrode 30.

Specifically, a first metal thin film is formed on the substrate 10 by a deposition process such as physical vapor deposition, and the first metal thin film is patterned to form an auxiliary source electrode 21 and an auxiliary drain electrode 31, as shown in FIG. 6. Optionally, the first metal thin film is made of one or a combination of low resistivity metals such as Mo, Al, Cu, and Ti, for example, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO.

Then, a buffer layer 11 is deposited on the auxiliary source electrode 21, the auxiliary drain electrode 31, and the substrate 10 by a deposition process such as chemical vapor deposition. The buffer layer 11 is made of silicon oxide (SiOx), silicon nitride (SiNx), or a stack of silicon oxide and silicon nitride.

Then, the source electrode 20 and the drain electrode 30 are formed on the buffer layer 11, and there is the first space between the source electrode 20 and the drain electrode 30, as shown in FIG. 7. The source electrode 20 and the drain electrode 30 are made of a ITO, IZO, AnCl, or other metal oxide with low resistivity. For example, the source electrode 20 and the drain electrode 30 are made of a metal oxide such as ITO. A difference in an etching size of a metal oxide such as ITO in a yellow light process is small. Due to a limitation of an exposure machine, a length of the first space between the source electrode 20 and the drain electrode 30 is made smaller, so that the active layer 40 has one channel 41 with a smaller length, thereby improving the electron mobility of the channel 41 of the active layer 40.

S303: forming an active layer 40 on the substrate 10, the source electrode 20, and the drain electrode 30, wherein the active layer 40 comprises a channel 41 and a source region 42 and a drain region 43 on both sides of the channel 41, the source region 42 covers at least part of the source electrode 20, the drain region 43 covers at least part of the drain electrode 30, and the channel 41 corresponds to the first space.

Specifically, a metal oxide semiconductor thin film is plated on the substrate 10, the source electrode 20 and the drain electrode 30, and the metal oxide semiconductor thin film is patterned to form the active layer 40. The active layer 40 comprises the channel 41 and the source region 42 and the drain region 43 on both sides of the channel 41, the source region 42 covers at least part of the source electrode 20, the drain region 43 covers at least part of the drain electrode 30, and the channel 41 corresponds to the first space, as shown in FIG. 8.

Optionally, the active layer 40 is made of a semiconductor metal oxide such as IGZO, IGZTO, IGTO, IGO, or AZTO.

S304: forming a gate electrode 50 on a side of the active layer 40 away from the substrate 10, wherein an orthographic projection of the gate electrode 50 on the substrate 10 covers an orthographic projection of the channel 41 of the active layer 40 on the substrate 10, covers an orthographic projection of at least part of the source region 42 of the active layer 40 on the substrate 10, and covers an orthographic projection of at least part of the drain region 43 of the active layer 40 on the substrate 10.

Specifically, an inorganic thin film is deposited on the active layer 40, the source electrode 20, the drain electrode 30, and the buffer layer 11 by a deposition process such as chemical vapor deposition. The inorganic thin film is made of one or a combination of SiOx, SiNx, and Al2O3, for example, Al2O3/SiNx/SiOx, or SiOx/SiNx/SiOx.

Next, a second metal thin film is deposited on the inorganic thin film by a deposition process such as physical vapor deposition, and the second metal thin film is patterned to form the gate electrode 50. The gate electrode 50 is disposed corresponding to the active layer 40. Optionally, a material of the second metal thin film may be same as a material of the first metal thin film.

Then, the inorganic thin film is patterned by a self-alignment process with the gate electrode 50 as a mask to form a gate insulating layer 12, as shown in FIG. 9.

The method for fabricating the driving substrate further comprises the following step:

forming a conductive layer 60 on a side of the gate electrode 50 away from the active layer 40, wherein the conductive layer 60 comprises a first electrode 61 and a connecting wire 62 that are spaced apart, the first electrode 61 is electrically connected to the source electrode 20 and the auxiliary source electrode 21, and the connecting wire 62 is electrically connected to the drain electrode 30 and the auxiliary drain electrode 31.

Specifically, a passivation layer 13 is deposited on the gate electrode 50, the source electrode 20, the drain electrode 30, and the buffer layer 11 by a deposition process such as chemical vapor deposition. The passivation layer 13 is made of silicon oxide (SiOx), silicon nitride (SiNx), or a stack of silicon oxide and silicon nitride.

The passivation layer 13 is patterned to form a plurality of first via holes 131 and a plurality of second via holes 132 in the passivation layer 13, as shown in FIG. 10. The first via holes 131 penetrate through the passivation layer 13, one of the first via holes 131 exposes another part of the source electrode 20, and the other one of the first via holes 131 exposes another part of the drain electrode 30. The second via holes 132 penetrate through the passivation layer 13 and the buffer layer 11, one of the second via holes 132 exposes a part of the auxiliary source electrode 21, and the other one of the second via holes 132 exposes a part of the auxiliary drain electrode 31.

Next, a conductive layer 60 is formed on the passivation layer 13, and the conductive layer 60 is patterned to form a first electrode 61 and a connecting wire 62, as shown in FIG. 1. The first electrode 61 is electrically connected to the source electrode 20 through one first via hole 131. At the same time, the first electrode 61 is also electrically connected to the auxiliary source electrode 21 through one second via hole 132. The connecting wire 62 is electrically connected to the drain electrode 30 through the other first via hole 131. At the same time, the connecting wire 62 is also electrically connected to the auxiliary drain electrode 31 through the other second via hole 132. In this way, a mask can realize the electrical connection between the source electrode 20 and the auxiliary source electrode 21, the electrical connection between the drain electrode 30 and the auxiliary drain electrode 31, and the electrical connection between the first electrode 61 and the source electrode 20, which is beneficial to save cost.

Optionally, the conductive layer 60 is made of a metal oxide electrode material such as IZO and ITO, or may be a three-metal layer anti-reflection structure of IZO/Mo/Cu, so as to reduce an influence of a light emitting unit on the channel 41 of the active layer 40.

Based on a same inventive concept, the present disclosure further provides a display panel. The display panel comprises the driving substrate of one of the foregoing embodiments. The display panel may be a liquid crystal display panel, an OLED display panel, an LED display panel, or the like. For example, when the display panel is an LED display panel, the display panel further comprises an LED chip, and the LED chip is bound on the driving substrate 100. Specifically, the driving substrate 100 further comprises a second electrode disposed on a same layer as the first electrode 61. The LED chip is electrically connected to the first electrode 61 and the second electrode of the driving substrate 100 to bound the LED chip to the driving substrate 100.

According to aforementioned embodiments, the following can be known.

The present disclosure provides a driving substrate, a method for fabricating the same, and a display panel. The driving substrate comprises a substrate, a source electrode, a drain electrode, and an active layer. The source electrode, the drain electrode, and the active layer are disposed on the substrate. There is a first space between the source electrode and the drain electrode. The active layer is further disposed on the source electrode and the drain electrode. The active layer comprises a channel and a source region and a drain region on both sides of the channel. The source region covers at least part of the source electrode. The drain region covers at least part of the drain electrode. The channel corresponds to the first space. In this way, a length of the channel of the active layer is defined by a space between the source electrode and the drain electrode, so as to reduce the length of the channel of the active layer, thereby improving an electron mobility of the channel of the active layer and solving a problem that improvement of an electron mobility of a current thin film transistor is limited.

In the above embodiments, the description of each embodiment has its own emphasis. For parts not detailed in one embodiment, reference may be made to the related descriptions in other embodiments.

The embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A driving substrate, comprising:
   a substrate;
   a source electrode and a drain electrode disposed on the substrate, wherein there is a first space between the source electrode and the drain electrode;
   an active layer disposed on the substrate, the source electrode, and the drain electrode, and comprising a channel and a source region and a drain region on both sides of the channel, wherein the source region covers at least part of the source electrode, the drain region covers at least part of the drain electrode, and the channel corresponds to the first space;
   a gate electrode disposed on a side of the active layer away from the source electrode and the drain electrode, and disposed corresponding to the active layer, wherein an orthographic projection of the gate electrode on the substrate covers an orthographic projection of the channel of the active layer on the substrate, covers an orthographic projection of at least part of the source region of the active layer on the substrate, and covers an orthographic projection of at least part of the drain region of the active layer on the substrate;
   an auxiliary source electrode disposed between the source electrode and the substrate and electrically connected to the source electrode; and
   an auxiliary drain electrode disposed between the drain electrode and the substrate and electrically connected to the drain electrode.

2. The driving substrate according to claim 1, further comprising:
   a conductive layer disposed on a side of the gate electrode away from the active layer, insulated from the gate electrode, and comprising a first electrode and a connecting wire that are spaced apart, wherein the first electrode is electrically connected to the source electrode and the auxiliary source electrode, and the connecting wire is electrically connected to the drain electrode and the auxiliary drain electrode.

3. The driving substrate according to claim 2, wherein an orthographic projection of the first electrode on the substrate at least covers the orthographic projection of the channel on the substrate.

4. The driving substrate according to claim 1, further comprising:
   a buffer layer covering the auxiliary source electrode and the auxiliary drain electrode, wherein the source electrode and the drain electrode are disposed on the buffer layer, and are respectively electrically connected to the corresponding source auxiliary electrode and the drain auxiliary electrode through via holes of the buffer layer.

5. The driving substrate according to claim 1, wherein in a direction perpendicular to the substrate, a thickness of the source electrode is less than a thickness of the auxiliary source electrode, and a thickness of the drain electrode is less than a thickness of the auxiliary drain electrode.

6. The driving substrate according to claim 1, wherein an orthographic projection of the auxiliary source electrode on the substrate at least covers the orthographic projection of the channel on the substrate.

7. The driving substrate according to claim 1, wherein the source electrode and the drain electrode are made of metal oxide.

8. A display panel, comprising a driving substrate, wherein the driving substrate comprises:
   a substrate;
   a source electrode and a drain electrode disposed on the substrate, wherein there is a first space between the source electrode and the drain electrode;
   an active layer disposed on the substrate, the source electrode, and the drain electrode, and comprising a channel and a source region and a drain region on both sides of the channel, wherein the source region covers at least part of the source electrode, the drain region covers at least part of the drain electrode, and the channel corresponds to the first space;

a gate electrode disposed on a side of the active layer away from the source electrode and the drain electrode, and disposed corresponding to the active layer, wherein an orthographic projection of the gate electrode on the substrate covers an orthographic projection of the channel of the active layer on the substrate, covers an orthographic projection of at least part of the source region of the active layer on the substrate, and covers an orthographic projection of at least part of the drain region of the active layer on the substrate;

an auxiliary source electrode disposed between the source electrode and the substrate and electrically connected to the source electrode; and an auxiliary drain electrode disposed between the drain electrode and the substrate and electrically connected to the drain electrode.

9. The display panel according to claim 8, wherein the driving substrate further comprises:

a conductive layer disposed on a side of the gate electrode away from the active layer, insulated from the gate electrode, and comprising a first electrode and a connecting wire that are spaced apart, wherein the first electrode is electrically connected to the source electrode and the auxiliary source electrode, and the connecting wire is electrically connected to the drain electrode and the auxiliary drain electrode.

10. The display panel according to claim 9, wherein an orthographic projection of the first electrode on the substrate at least covers the orthographic projection of the channel on the substrate.

11. The display panel according to claim 10, wherein the driving substrate further comprises:

a buffer layer covering the auxiliary source electrode and the auxiliary drain electrode, wherein the source electrode and the drain electrode are disposed on the buffer layer, and are respectively electrically connected to the corresponding source auxiliary electrode and the drain auxiliary electrode through via holes of the buffer layer.

12. The display panel according to claim 8, wherein in a direction perpendicular to the substrate, a thickness of the source electrode is less than a thickness of the auxiliary source electrode, and a thickness of the drain electrode is less than a thickness of the auxiliary drain electrode.

13. The display panel according to claim 8, wherein an orthographic projection of the auxiliary source electrode on the substrate at least covers the orthographic projection of the channel on the substrate.

14. The display panel according to claim 8, wherein the source electrode and the drain electrode are made of metal oxide.

15. A method for fabricating a driving substrate, comprising:

providing a substrate;

forming a first metal thin film on the substrate by physical vapor deposition;

patterning the first metal thin film to form an auxiliary source electrode and an auxiliary drain electrode;

depositing a buffer layer on the auxiliary source electrode, the auxiliary drain electrode, and the substrate by chemical vapor deposition;

forming a source electrode and a drain electrode on the buffer layer, wherein there is a first space between the source electrode and the drain electrode;

forming an active layer on the substrate, the source electrode, and the drain electrode, wherein the active layer comprises a channel and a source region and a drain region on both sides of the channel, the source region covers at least part of the source electrode, the drain region covers at least part of the drain electrode, and the channel corresponds to the first space; and forming a gate electrode on a side of the active layer away from the substrate, wherein an orthographic projection of the gate electrode on the substrate covers an orthographic projection of the channel of the active layer on the substrate, covers an orthographic projection of at least part of the source region of the active layer on the substrate, and covers an orthographic projection of at least part of the drain region of the active layer on the substrate.

16. The method for fabricating the driving substrate according to claim 7, further comprising:

forming a conductive layer on a side of the gate electrode away from the active layer, wherein the conductive layer comprises a first electrode and a connecting wire that are spaced apart, the first electrode is electrically connected to the source electrode and the auxiliary source electrode, and the connecting wire is electrically connected to the drain electrode and the auxiliary drain electrode.

* * * * *